United States Patent
Huberman et al.

(10) Patent No.: US 10,197,398 B1
(45) Date of Patent: *Feb. 5, 2019

(54) MOBILE DEVICE LOCALIZATION BASED ON SPATIAL DERIVATIVE MAGNETIC FINGERPRINT

(71) Applicant: MAPSTED CORP., Mississauga (CA)

(72) Inventors: Sean Huberman, Guelph (CA); Eros Gulo, Woodbridge (CA)

(73) Assignee: MAPSTED CORP., Mississauga, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/029,689

(22) Filed: Jul. 9, 2018

Related U.S. Application Data

(63) Continuation of application No. 15/827,748, filed on Nov. 30, 2017, now Pat. No. 10,070,270.

(51) Int. Cl.
| | |
|---|---|
| *H04W 4/02* | (2018.01) |
| *G01C 21/00* | (2006.01) |
| *G01C 21/08* | (2006.01) |
| *G01R 33/10* | (2006.01) |
| G01C 21/30 | (2006.01) |
| G01C 21/20 | (2006.01) |

(52) U.S. Cl.
CPC ........... *G01C 21/08* (2013.01); *G01C 21/005* (2013.01); *G01R 33/10* (2013.01); *H04W 4/027* (2013.01); *G01C 21/206* (2013.01); *G01C 21/30* (2013.01)

(58) Field of Classification Search
CPC ...... G01R 33/10; G01C 21/08; G01C 21/005; G01C 21/206; G01C 21/30; H04W 4/043; H04W 4/027

USPC ....................................................... 455/456.3
See application file for complete search history.

(56) References Cited

U.S. PATENT DOCUMENTS

| | | | |
|---|---|---|---|
| 6,539,327 B1 | 3/2003 | Dassot et al. | |
| 2006/0267833 A1* | 11/2006 | Langford | G01S 5/0252 342/174 |
| 2013/0150076 A1 | 6/2013 | Kim et al. | |
| 2013/0303185 A1* | 11/2013 | Kim | H04W 4/02 455/456.1 |
| 2014/0141803 A1* | 5/2014 | Marti | H04W 4/043 455/456.2 |
| 2014/0180627 A1 | 6/2014 | Naguib et al. | |
| 2014/0335893 A1* | 11/2014 | Ronen | G01S 5/0252 455/456.1 |
| 2015/0018018 A1 | 1/2015 | Shen et al. | |
| 2015/0346317 A1* | 12/2015 | Patel | G01S 5/0289 455/456.1 |

(Continued)

*Primary Examiner* — William Nealon
(74) *Attorney, Agent, or Firm* — Henry L. Ohab

(57) ABSTRACT

A method and system for localizing a mobile device includes deriving and using a spatial derivative magnetic signature or fingerprint. The method, executed in a processor of the mobile device, comprises monitoring mobile device magnetic data along a route being traversed, deriving, from the mobile device magnetic data, a mobile device spatial derivative magnetic fingerprint along the route, accessing a repository of spatial derivative magnetic fingerprint data having associated respective positions along the route, and localizing the mobile device based at least partly on matching the mobile device spatial derivative magnetic fingerprint with the spatial derivative magnetic fingerprint data of the repository.

16 Claims, 4 Drawing Sheets

(56) References Cited

U.S. PATENT DOCUMENTS

2016/0011022 A1    1/2016   Zheng et al.
2018/0007515 A1*   1/2018   Arslan ................. G01C 21/206

* cited by examiner

MOBILE DEVICE LOCALIZATION BASED ON SPATIAL DERIVATIVE MAGNETIC FINGERPRINT

CROSS-REFERENCE TO RELATED APPLICATION

This application claims the benefit of priority to U.S. Application No. 15/827,748 filed Nov. 30, 2017, now issued as U.S. Patent No. 10,070,270, and hereby incorporates said U.S. Application No. 15/827,748 in the entirety herein.

TECHNICAL FIELD

The disclosure herein relates to the field of mobile device navigation and positioning.

BACKGROUND

Users of mobile devices are increasingly using and depending upon indoor positioning and navigation applications and features. Seamless, accurate and dependable indoor positioning of a mobile device as carried or worn by a user can be difficult to achieve using satellite-based navigation systems when the latter becomes unavailable, or sporadically available, and therefore unreliable, such as within enclosed or partially enclosed urban infrastructure and buildings, including hospitals, shopping malls, airports, universities and industrial warehouses. Wireless communication signal data and magnetic field data may be measured to aid in localizing a mobile device along a route traversed.

DETAILED DESCRIPTION

Figure 1:
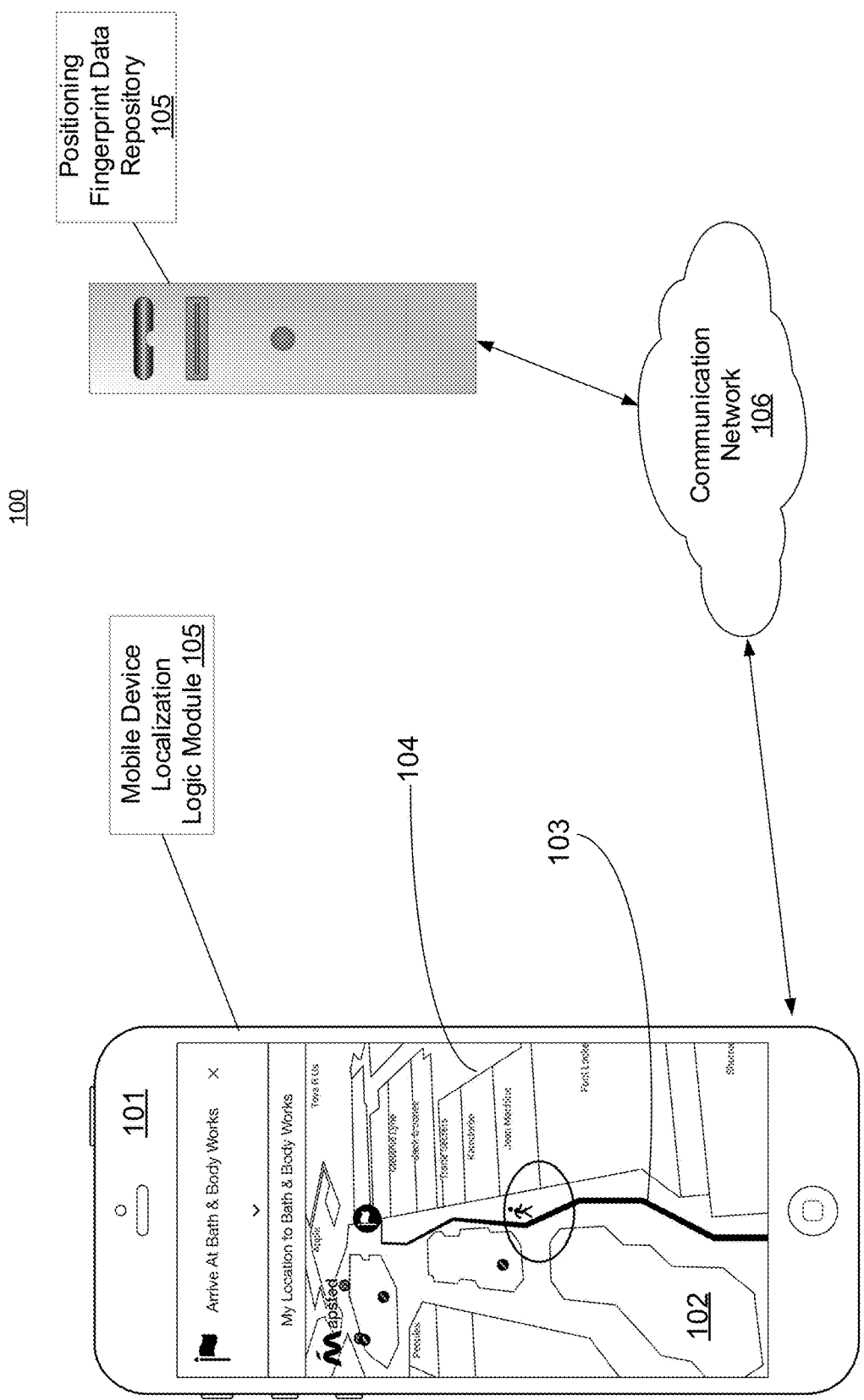
FIG. 1 illustrates, in an example embodiment, a system for localizing a mobile device.

Embodiments herein provide for localizing a position of a mobile device at least in part based on calculating a spatial derivative magnetic fingerprint that corresponds and correlates to magnetic fingerprint data acquired at positions along a trajectory of the mobile device. A spatial derivative of magnetic field data, the magnetic field data including but not limited to magnetic field strength and direction, may be matched or compared to a pre-existing repository of reference spatial magnetic field data in order to determine a unique location, or position of, a mobile device traversing a route or trajectory in two- or three-dimensional space. The latter process of determining a unique location or position of the mobile device in two- or three-dimensional space is referred to herein as localizing the mobile device, or mobile device localization.

Among other benefits and technical effects, it is recognized that different mobile devices, such as smartphones, commonly produce varying or different magnetic field measurements within a given magnetic field, including measurements of magnetic field strength, for example. While the values of parameters being measured by magnetometer sensor devices of different smartphones, for example magnetic field strength values might differ in absolute magnitude, the spatial patterns in variation of the separate absolute measurements present similar and comparable signatures. Reasons for variation in absolute values of magnetic measurements within a given magnetic field may be due to particular internal components used to build mobile devices, and also the particular external accessories (cases, covers, and other attachments) attached and deployed by a user to customize a smartphone. The inventors recognize that using spatial derivatives of magnetic field measurements, rather than absolute values of magnetic field measurements, allows for more effectively capturing a curvature, trend or pattern of the magnetic field during a spatial route traversal and provides basis for localizing a magnetic sensor-equipped mobile computing device in conjunction with a pre-calibrated or reference fingerprint map of an area that includes spatial derivatives of magnetic field data. Thus, using spatial derivatives enables assessment of the relative changes in magnetic field as a mobile device traverses particular locations or positions sequentially within an area, and provides a unique signature across individual mobile devices, even when those individual devices exhibit differing magnetic field absolute measurements. The inventors also recognize that mobile device trends or patterns of a magnetic field over a space or area being traversed may enable localization in a robust and repeatable manner across different phones which, while measuring significantly different magnetic field absolute values, may still exhibit a same, or significantly similar, magnetic field trend or pattern signature.

Also provided is a mobile device including a processor and a memory storing a set of computer instructions. The instructions are executable in the processor to monitor magnetic data acquired by the mobile device along a route being traversed, derive, from the mobile device magnetic data, a mobile device spatial derivative magnetic fingerprint along the route, access a repository of spatial derivative magnetic fingerprint data having associated respective positions along the route, and localize the mobile device based at least partly on matching the mobile device spatial derivative magnetic fingerprint with the spatial derivative magnetic fingerprint data of the repository.

One or more embodiments described herein provide that methods, techniques, and actions performed by a computing device are performed programmatically, or as a computer-implemented method. Programmatically, as used herein, means through the use of code or computer-executable instructions. These instructions can be stored in one or more memory resources of the computing device. A programmatically performed step may or may not be automatic.

One or more embodiments described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

A mobile device as described herein may be implemented, in whole or in part, on mobile computing devices such as cellular or smartphones, laptop computers, wearable computer devices, and tablet devices. Memory, processing, and network resources may all be used in connection with the use and performance of embodiments described herein, including with the performance of any method or with the implementation of any system.

Furthermore, one or more embodiments described herein may be implemented through the use of logic instructions that are executable by one or more processors. These instructions may be carried on a computer-readable medium. In particular, machines shown with embodiments herein include processor(s) and various forms of memory for storing data and instructions. Examples of computer-readable mediums and computer storage mediums include portable memory storage units, and flash memory (such as carried on smartphones). A mobile device as described herein utilizes processors, memory, and logic instructions stored on computer-readable medium. Embodiments described herein may be implemented in the form of computer processor- executable logic instructions or programs stored on computer memory mediums.

SYSTEM DESCRIPTION

FIG. 1 illustrates, in an example embodiment, mobile device localization system 100 including mobile device 101. Mobile device 101 may be such as a cellular or smartphone, a laptop or a tablet computer, or a wearable computer device that is operational for any one or more of telephony, messaging, and data computing. Mobile device 101 may be connected within a computer network system, including the internet or other wide area network, to one or more remote server computing devices. Mobile device 101 may include mobile device localization logic module 105, the latter embodied according to computer processor- executable instructions stored within a memory of, or otherwise accessible to a processor of, mobile device 101. In alternate embodiments, it is contemplated that one or more portions of mobile device localization logic module 105 may be stored at the remote server computing devices, while being communicatively accessible to mobile device 101 via communication network 106.

A navigation, or positioning, software application downloaded and installed, or stored, in a memory of mobile device 101 may render physical layout map 102 related to a facility or building within a user interface display of mobile device 101. In one embodiment, the navigation software application may incorporate mobile device localization logic module 105. The terms indoor facility or building as used herein means an at least partially enclosed building having at least one fixed boundary, such as an exterior boundary wall. Display of physical layout map 102 may further show trajectory or route 103 traversed by the mobile device, which may include an estimated trajectory segment predicted for traversal by mobile device 101. Physical layout map 102 may further depict one or more map constraint features 104, such as an internal wall or other map constraint feature including a doorway, a facility exit, a physical marker fixed in place, a facility entrance, a stairwell, a stairway, a corridor, an elevator, and an external boundary outline of the indoor facility.

Positioning fingerprint data repository 105 may be communicatively accessible to mobile device 101, for instance via communication network 106. In alternate embodiments, positioning fingerprint data repository 105, or any portion(s) thereof, may be stored in a memory of mobile device 101. The terms fingerprint and fingerprint data as used herein refer to time-correlated, individual measurements of any of, or any combination of, received wireless communication signal strength and signal connectivity parameters, magnetic field parameters or barometric pressure parameters, and mobile device inertial sensor data at known, particular locations along a route being traversed, or anticipated for traversal, by the mobile device. In other words, a fingerprint includes a correlation of sensor and signal information (including, but not necessarily limited to wireless signal strength, magnetic or barometric information, inertial sensor information) associated for a unique location relative to the facility. Thus, fingerprint data associated with a particular location or position provides a signature that uniquely correlates to that particular location or position. Once a particular fingerprint or signature based on any of received wireless communication signal strength and signal connectivity parameters, magnetic field parameters or barometric pressure parameters, and mobile device inertial sensor data is detected or recorded by mobile device 101, the fingerprint as detected may be matched to a reference fingerprint stored in a fingerprint map of a given facility, for example as stored in positioning fingerprint data repository 105, to identify the unique position of the mobile device relative to the facility, a process also referred to herein as localization. A sequence of positions or locations that constitute a navigation path traversed by the mobile device relative to the indoor facility may be mapped for fingerprint data during a fingerprint calibration process. In some embodiments, given that sampling times and sampling rates applied in conjunction with particular mobile device sensors may be different, the signal and sensor information as measured during a fingerprint calibration process may be time-averaged across particular periods of time, with the time-averaged value being used to represent the signal information at any given instance of time within that particular period of time in which the signal information is time-averaged. Fingerprint data may be used to track mobile device 101 traversal along route 103 within, and even adjoining, the indoor facility.

In the case of magnetic fingerprint or signature data, the fingerprint may include magnetic field strength and direction data as measured by a magnetometer sensor device of mobile device 101, and may further include magnetic spatial derivative values, derived or calculated from measured magnetic data, including magnetic field strength and magnetic field direction data, for example. Magnetic spatial derivative fingerprint data including magnetic spatial derivative values, and also a pattern of variation of the magnetic spatial derivative values, compiled and stored in a fingerprint map at positioning fingerprint data repository 105 may be used to localize mobile device 101 along respective particular positions of route 103 being traversed.

Figure 2:
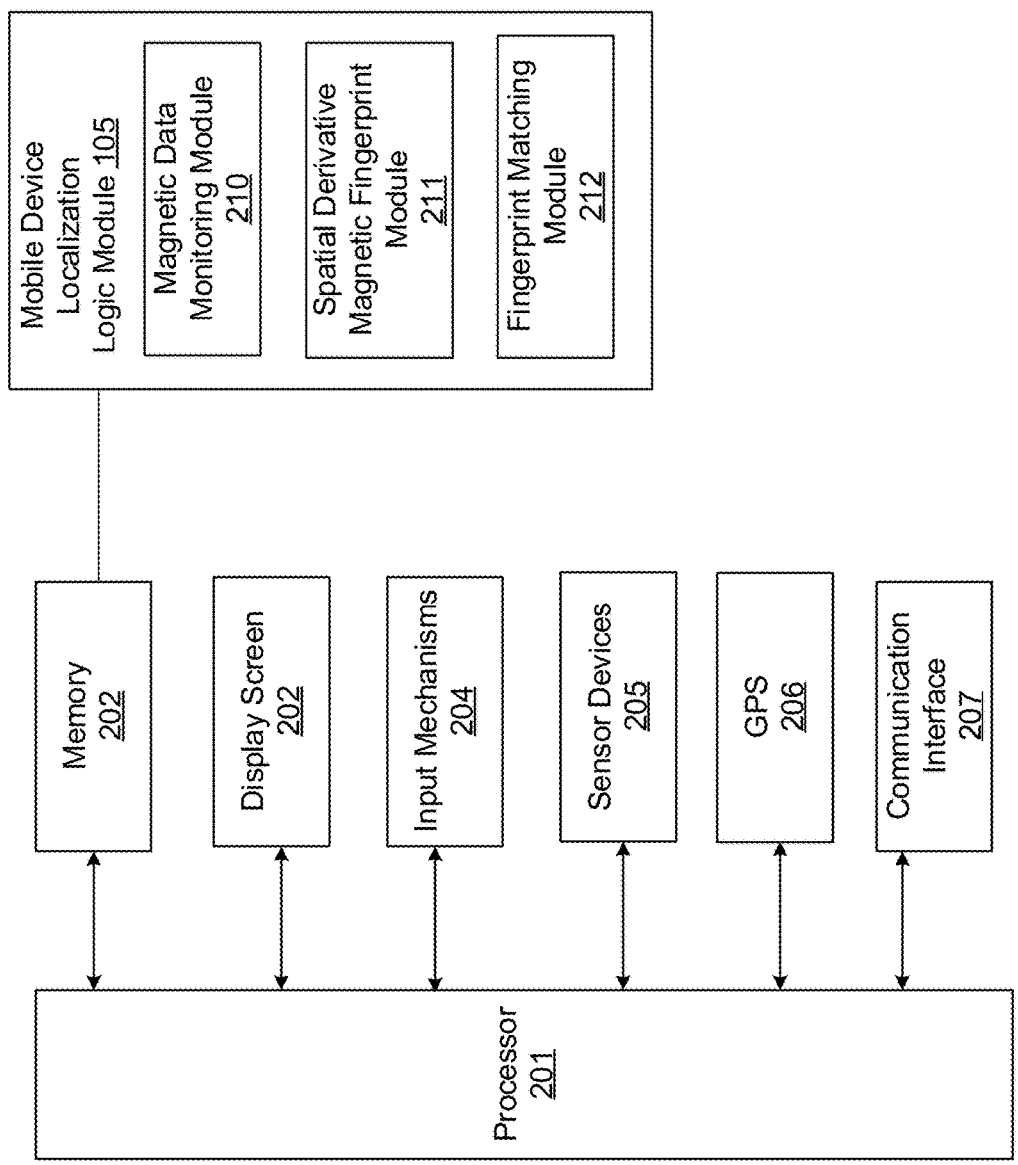
FIG. 2 illustrates, in one example embodiment, an architecture of a mobile device including localization capability based on a spatial derivative magnetic fingerprint.

FIG. 2 illustrates an architecture of mobile device 101 having a position state transition detection capability, in one embodiment. Mobile device 101 may include processor 201, memory 202, display screen 203, input mechanisms 204 such as a keyboard or software-implemented touchscreen input functionality, barcode, QR code or other symbol- or code- scanner input functionality. Mobile device 101 may include sensor functionality by way of sensor devices 205. Sensor devices 205 may include inertial sensors such as an accelerometer and a gyroscope, and magnetometer or other magnetic field sensing functionality, barometric or other ambient pressure sensing functionality, and ambient lighting sensors, such as to detect ambient lighting intensity. Mobile device 101 may also include capability for detecting and communicatively accessing ambient wireless communication signals including but not limited to any of Bluetooth and Bluetooth Low Energy (BLE), Wi-Fi, RFID, and also satellite-based navigations signals including global positioning system (GPS) signals. Mobile device 101 further includes the capability for detecting, via sensor devices 205, and measuring a received signal strength, and of determining signal connectivity parameters, related to the ambient wireless signals. In particular, mobile device 101 may include location determination capability such as by way of GPS module 206 having a GPS receiver, and communication interface 207 for communicatively coupling to communication network 106, including by sending and receiving cellular data over data and voice channels.

Mobile device localization logic module 105 includes instructions stored in memory 202 of mobile device 101. In embodiments, mobile device localization logic module 105 may be included in a mobile device navigation application program stored in memory 202 of mobile device 101. The term indoor location as used herein refers to a location within the facility or building, such as within a shopping mall, an airport, a warehouse, a university campus, or any at least partially enclosed building. Mobile device localization logic module 105 may comprise sub-modules including magnetic data monitoring module 210, spatial derivative magnetic fingerprint module 211 and fingerprint matching module 212.

Processor 201 uses executable instructions stored in magnetic data monitoring module 210 to monitor mobile device 101 magnetic data along a route 103 being traversed.

Processor 201 uses executable instructions stored in spatial derivative magnetic fingerprint module 211 to derive, from the mobile device 101 magnetic data, a mobile device spatial derivative magnetic fingerprint for spatial locations or positions along route 103.

Processor 201 uses executable instructions stored in fingerprint matching module 212 to access repository 105 of spatial derivative magnetic fingerprint data associated with respective positions along route 103 and also to localize mobile device 101 based at least partly on matching mobile device 101 spatial derivative magnetic fingerprint with the spatial derivative magnetic fingerprint data of repository 105.

Figure 3A:
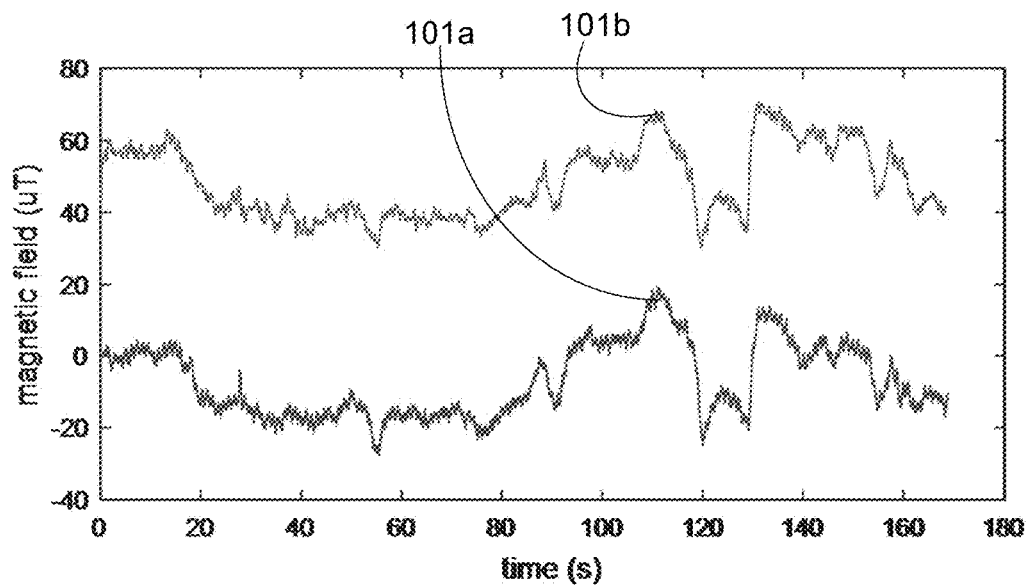
FIG. 3A illustrates a variation in magnetic field strength detected and measured according to respective mobile devices.

FIG. 3A depicts respective variations in magnetic field strength as might be typically detected and measured by two different mobile devices 101a, 101b, in an example illustration. It is observed that while the values of parameters being measured, for example magnetic field strength parameters represented by corresponding absolute values 101a, 101b measured at a given point in space in the facility, might differ in absolute magnitudes, the spatial patterns in variation or trend of the respective absolute measurements provide similar or comparable signatures. The reason for variation in absolute values of magnetic measurements within a given magnetic field may include particular internal components used to build mobile devices 101a, 101b, and also the particular external accessories (cases, covers, and other attachments) attached and deployed by a user to customize a smartphone.

Figure 3B:
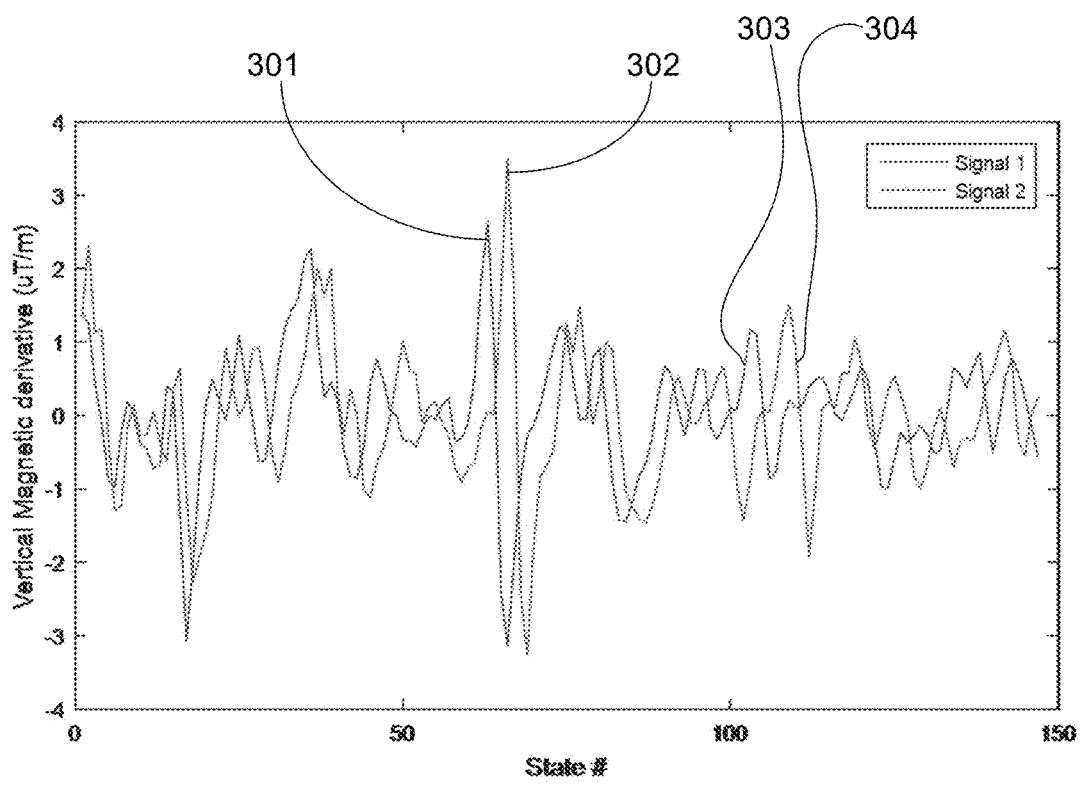
FIG. 3B illustrates magnetic field spatial derivative patterns for a mobile device versus a magnetic fingerprint data repository.

FIG. 3B depicts magnetic field spatial derivative patterns for mobile device 101 versus a magnetic spatial derivative fingerprint data of positioning fingerprint data repository 105, in an example illustration. The x-axis represents a spatial state number that may be assigned in a distance traversed by mobile device 101 at step-sized intervals of distance. Once a magnetic spatial derivative pattern or pattern segment is derived using processor 201 of mobile device 101 for a route 103 being traversed, particular point 301 of mobile phone 101 spatial derivative pattern 303 may be localized to the particular position associated with corresponding point 302 of matching magnetic spatial derivative fingerprint pattern 304 in positioning fingerprint data repository 105.

METHODOLOGY

Figure 4:
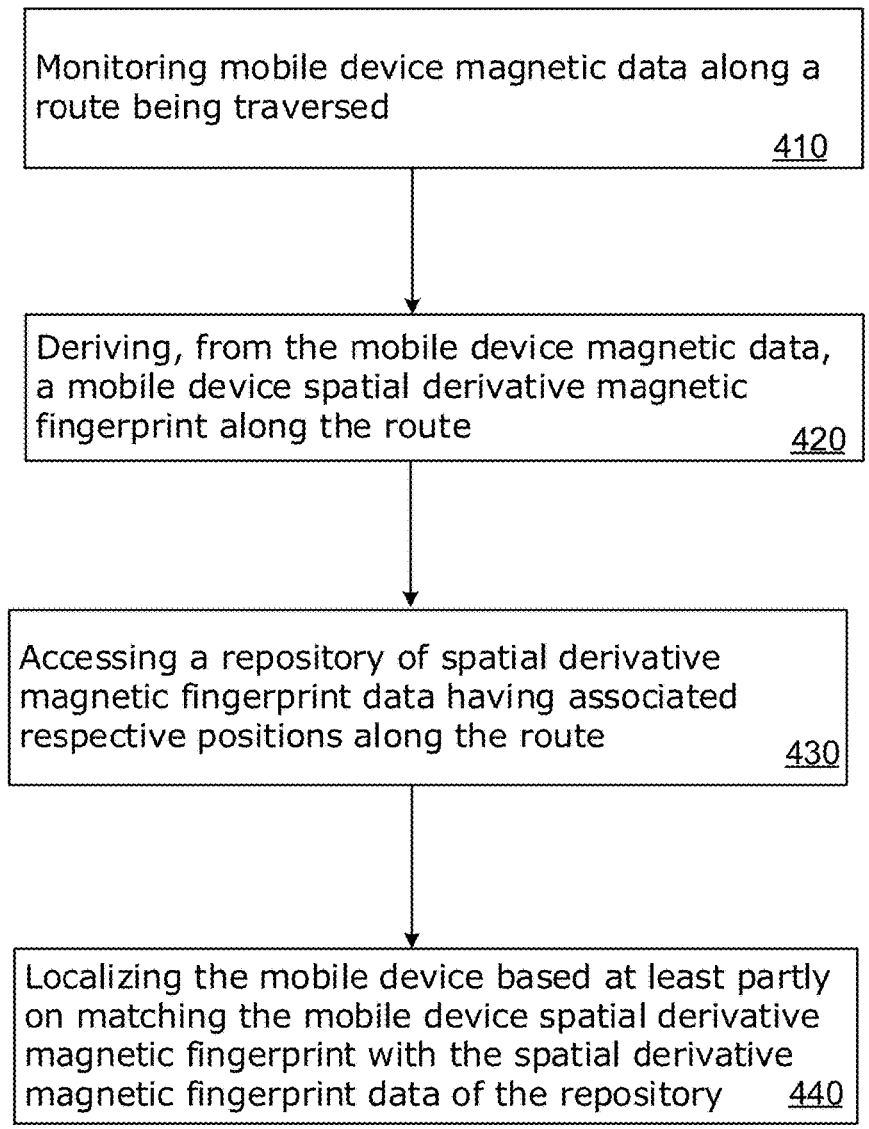
FIG. 4 illustrates, in an example embodiment, a method of localizing a mobile device based on a spatial derivative magnetic fingerprint.

FIG. 4 illustrates, in an example embodiment, a method of localizing mobile device 101 based at least partly on a spatial derivative magnetic fingerprint. In describing examples of FIG. 4, reference is made to the examples of FIGS. 1-3 for purposes of illustrating suitable components or elements for performing a step or sub-step being described.

Examples of method steps described herein relate to the use of mobile device 101 for implementing the techniques described. According to one embodiment, the techniques are performed by mobile device localization logic module 105 of mobile device 101 in response to the processor 201 executing one or more sequences of software logic instructions that constitute mobile device localization logic module 105. In embodiments, mobile device localization logic module 105 may include the one or more sequences of instructions within sub-modules including magnetic data monitoring module 210, spatial derivative magnetic fingerprint module 211 and fingerprint matching module 212. Such instructions may be read into memory 202 from machine-readable medium, such as memory storage devices. In executing the sequences of instructions contained in magnetic data monitoring module 210, spatial derivative magnetic fingerprint module 211 and fingerprint matching module 212 of mobile device localization logic module 105 in memory 202, processor 201 performs the process steps described herein. In alternative implementations, at least some hard-wired circuitry may be used in place of, or in combination with, the software logic instructions to implement examples described herein. Thus, the examples described herein are not limited to any particular combination of hardware circuitry and software instructions. Additionally, it is contemplated that in alternative embodiments, the techniques herein, or portions thereof, may be distributed between the mobile device 101 and a remote server computing device. For example, the mobile device may collect and transmit data to the server that, in turn, performs at least some portion of the techniques described herein.

At step 410, processor 201 executes instructions included in magnetic data monitoring module 210, to monitor mobile device 101 magnetic data along a route 103 being traversed.

In embodiments, mobile device 101 magnetic data may include a set of magnetic field measurements, such as but not limited to measurements of magnetic field strength and direction, along route 103. Route 103 being traversed may be such as a hallway, a corridor, a pedestrian path, a set of stairs or a route commencing from any of an entrance, an exit or a location within or near a building.

At step 420, processor 201 executes instructions included in spatial derivative magnetic fingerprint module 211 to derive, from the mobile device 101 magnetic data, a mobile device 101 spatial derivative magnetic fingerprint along route 103.

According to an example embodiment for deriving or calculating the magnetic field spatial derivative using processor 201, an average magnetic field value, which may be a magnetic field strength value, associated with a given position or spatial state may calculated based on the absolute magnetic field measurements for at least a pair of given contiguous or adjacent positions. For each adjacent pair of position states, the resulting value will represent the spatial derivative of one state to the next. This operation results in one averaged value per spatial segment for each of the x, y, and z axes in a coordinate system of mobile device 101. Then take the difference between corresponding x, y, and z magnetic field components and calculate the dot product of the differences with the gravity vector ($g^x$, $g^y$, $g^z$). The result would be the difference in vertical component of the magnetic field between two adjacent spatial segments. Finally, the latter difference is divided by the distance between the two segments to derive the spatial derivative. The operation, in this example embodiment, may be summarized in the equation below:

$$\frac{dm^v}{dl} = \frac{g^x(m_2^x - m_1^x) + g^y(m_2^y - m_1^y) + g^z(m_2^z - m_1^z)}{l}$$

In this example embodiment, $$\frac{dm^v}{dl}$$

represents the magnetic spatial derivative for the gravity vector for vertical orientation component of mobile device 101 in the mobile device 101 coordinate system, m represents magnetic field strength as measured, l represents the distance between the adjacent position states, and a represents the gravity vector. In embodiments, mobile device 101 spatial derivative magnetic field data, and spatial derivative magnetic field fingerprint data for repository 105, includes at least one of a horizontal and a vertical magnetic field component value in addition to an absolute magnitude measurement.

At step 430, processor 201 executes instructions included in fingerprint matching module 212 to access repository 105 of spatial derivative magnetic fingerprint data associated with respective positions along route 103. In embodiments, the fingerprint map data stored in fingerprint data repository 105 (also referred to herein as repository 105) further associates particular positions along route 103 with any combination of fingerprint data, including gyroscope data, accelerometer data, wireless signal strength data, wireless connectivity data, barometric data, acoustic data, line-of sight data, and ambient lighting data, in addition to magnetic data stored thereon.

In embodiments, the data of repository 105 may be accessible in memory 202 of mobile device 101, and also accessible from a server computing device via wireless communication network 106.

At step 440, processor 201 executes further instructions included in fingerprint matching module 212 to localize mobile device 101 based at least partly on matching mobile device 101 spatial derivative magnetic fingerprint with the spatial derivative magnetic fingerprint data of repository 105.

In embodiments, mobile device 101 spatial derivative magnetic data establishes a pattern for the set of magnetic field measurements along route 103. Fingerprint matching module 212 matches the fingerprint pattern with an identified correlating pattern, or a portion of a larger fingerprint pattern, from repository 105 storing the spatial derivative magnetic fingerprint data. Mobile device 101 may be localized by identifying, based on the matching, a position of mobile device 101 among respective positions or locations along route 103 associated with a pattern or trend as indicated by the magnetic spatial derivative data of the fingerprint map accessible at repository 105. In another embodiment, mobile device 101 spatial derivative magnetic fingerprint derived along the route 103 may be added to repository 105.

It is contemplated for embodiments described herein to extend to individual elements and concepts described herein, independently of other concepts, ideas or system, as well as for embodiments to include combinations of elements recited anywhere in this application. Although embodiments are described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mention of the particular feature. Thus, the absence of describing combinations should not preclude the inventor from claiming rights to such combinations.

What is claimed is:

1. A method for localizing a mobile device having a processor and a memory, the method comprising:
deriving, using the processor, from mobile device magnetic data obtained along a sequence of positions being traversed, a mobile device spatial derivative magnetic signature pattern, the mobile device spatial derivative magnetic signature pattern derived at least in part based on absolute magnetic field measurements for at least a pair of contiguous positions in the sequence of positions, wherein the mobile device magnetic data comprises a set of magnetic field measurements along the route;
accessing, using the processor, a repository of spatial derivative magnetic fingerprint data; and
using the processor, localizing the mobile device based at least in part on matching the mobile device spatial derivative magnetic signature pattern with a correlating pattern of the spatial derivative magnetic fingerprint data of the repository.

2. The method of claim 1 wherein the localizing comprises identifying, based on the matching, a position of the mobile device along the sequence of positions.

3. The method of claim 1 wherein the mobile device spatial derivative magnetic fingerprint includes at least one of a horizontal magnetic field component measurement, a vertical magnetic field component measurement and an absolute magnitude magnetic field measurement values.

4. The method of claim 1 wherein the mobile device is one of a smartphone, a wireless communication device and a wearable computing device.

5. The method of claim 4 wherein the repository is one of accessible in the memory and accessible from a server computing device via a wireless communication network.

6. The method of claim 1 wherein the sequence of positions is along at least one of a hallway, a corridor, a pedestrian path, a set of stairs and a route commencing from at least an entrance of a building.

7. The method of claim 1 wherein the repository further includes at least one of wireless signal strength data, wireless connectivity data, barometric pressure data, accelerometer data, gyroscope data, magnetometer data and ambient lighting sensor data associated with the respective positions along the route.

8. The method of claim 1 further comprising adding the mobile device spatial derivative magnetic fingerprint derived along the sequence of positions to the repository.

9. A mobile device comprising:

a processor;

a memory storing a set of instructions, the instructions executable in the processor to:

derive, using the processor, from mobile device magnetic data along a sequence of positions being traversed, a mobile device spatial derivative magnetic signature pattern, the mobile device spatial derivative magnetic signature pattern derived at least in part based on respective absolute magnetic field measurements for at least a pair of contiguous positions in the sequence of positions, wherein the mobile device magnetic data comprises a set of magnetic field measurements along the route;

access using the processor, a repository of spatial derivative magnetic fingerprint data; and using the processor, localize the mobile device based at least in part on matching the mobile device spatial derivative magnetic signature pattern with a correlating pattern of the spatial derivative magnetic fingerprint data of the repository.

10. The mobile device of claim 9 wherein the localizing comprises identifying, based on the matching, a position of the mobile device along the sequence of positions.

11. The mobile device of claim 9 wherein the mobile device spatial derivative magnetic fingerprint includes at least one of a horizontal magnetic field component value, a vertical magnetic field component value and an absolute magnitude magnetic field measurement value.

12. The mobile device of claim 9 wherein the mobile device is one of a smartphone, a wireless communication device and a wearable computing device.

13. The mobile device of claim 9 wherein the repository is one of accessible in the memory and accessible from a server computing device via a wireless communication network.

14. The mobile device of claim 9 wherein the sequence of positions is along at least one of a hallway, a corridor, a pedestrian path, a set of stairs and a route commencing from at least an entrance of a building.

15. The mobile device of claim 9 wherein the repository further includes at least one of wireless signal strength data, wireless connectivity data, barometric pressure data, accelerometer data, gyroscope data, magnetometer data and ambient lighting sensor data associated with the respective positions along the route.

16. The mobile device of claim 9 further comprising adding the mobile device spatial derivative magnetic fingerprint derived along the sequence of positions to the repository.

* * * * *